(12) United States Patent
Cheng et al.

(10) Patent No.: US 10,141,339 B2
(45) Date of Patent: Nov. 27, 2018

(54) EMBEDDED SECURITY CIRCUIT FORMED BY DIRECTED SELF-ASSEMBLY

(71) Applicant: International Business Machines Corporation, Armonk, NY (US)

(72) Inventors: Kangguo Cheng, Schenectady, NY (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/809,937

(22) Filed: Nov. 10, 2017

(65) Prior Publication Data

US 2018/0069028 A1 Mar. 8, 2018

Related U.S. Application Data

(62) Division of application No. 14/984,118, filed on Dec. 30, 2015, now Pat. No. 9,917,106.

(51) Int. Cl.

| H01L 21/308 | (2006.01) |
| H01L 21/84 | (2006.01) |
| H01L 23/58 | (2006.01) |
| H01L 27/02 | (2006.01) |
| H01L 27/12 | (2006.01) |
| H01L 29/66 | (2006.01) |

(52) U.S. Cl.
CPC ...... *H01L 27/1211* (2013.01); *H01L 21/3081* (2013.01); *H01L 21/3086* (2013.01); *H01L 21/845* (2013.01); *H01L 23/58* (2013.01); *H01L 27/0207* (2013.01); *H01L 29/6681* (2013.01); *H05K 999/99* (2013.01)

(58) Field of Classification Search
CPC .................................................. H01L 29/6681
See application file for complete search history.

(56) References Cited

U.S. PATENT DOCUMENTS

| 7,605,081 B2 * | 10/2009 | Yang | ............. H01L 21/0332 257/E21.577 |
| 8,759,976 B2 | 6/2014 | Edelstein et al. | |
| 2015/0084193 A1 * | 3/2015 | Feng | ............. H01L 23/535 257/741 |

OTHER PUBLICATIONS

S. Devadas et al., "Design and Implementation of PUF-Based "Unclonable" RFID ICs for Anti-Counterfeiting and Security Applications," IEEE International Conference on RFID, Apr. 2008, pp. 58-64.

(Continued)

*Primary Examiner* — Raj R Gupta
(74) *Attorney, Agent, or Firm* — Vazken Alexanian; Ryan, Mason & Lewis, LLP

(57) ABSTRACT

Embedded security circuits formed by directed self-assembly and methods for creating the same are provided herein. An example integrated circuit includes a set of one or more fin field effect transistor devices unrelated to one or more security devices of the integrated circuit; and an embedded security circuit structure comprising an array of fin field effect transistor devices related to the one or more security devices of the integrated circuit, wherein the array comprises a combination of (i) one or more fin field effect transistor devices with unbroken fin channels and (ii) one or more fin field effect transistor devices with broken fin channels, and wherein the combination forms a distinct code to be associated with the integrated circuit.

20 Claims, 9 Drawing Sheets

(56) References Cited

OTHER PUBLICATIONS

M.P. Stoykovich et al., "Directed Assembly of Block Copolymer Blends into Nonregular Device-Oriented Structures," Science, www.sciencemag.org, Jun. 2005, pp. 1442-1446, vol. 308.
S.-J. Jeong et al., "Directed Self-Assembly of Block Copolymers for Next Generation Nanolithography," Materials Today, Dec. 2013, pp. 468-476, vol. 16, No. 12.
Yasmine Badr, "Selected Papers on Directed Self Assembly (DSA)," SPIE, UCLA, NanoCAD Lab, Aug. 2014, 21 pages.
D.J. Guerrero et al., "Multifunctional Hardmask Neutral Layer for Directed Self-Assembly (DSA) Patterning," Proceedings of the Society of Photo-Optical Instrumentation Engineers (SPIE), Mar. 26, 2013, vol. 8680, 9 pages.
J.-W. Lee et al., "Directed Self-Assembly Process and Materials Development," Dongjin Semichem Co., Ltd., Sematech Symposium Korea, Sep. 2012, 21 pages, Seoul, Korea.
H. Yi et al., "Flexible Control of Block Copolymer Directed Self-Assembly Using Small, Topographical Templates: Potential Lithography Solution for Integrated Circuit Contact Hole Patterning," Advanced Materials, Jun. 19, 2012, pp. 3107-3114, vol. 24, No. 23.
List of IBM Patents or Patent Applications Treated as Related.

\* cited by examiner

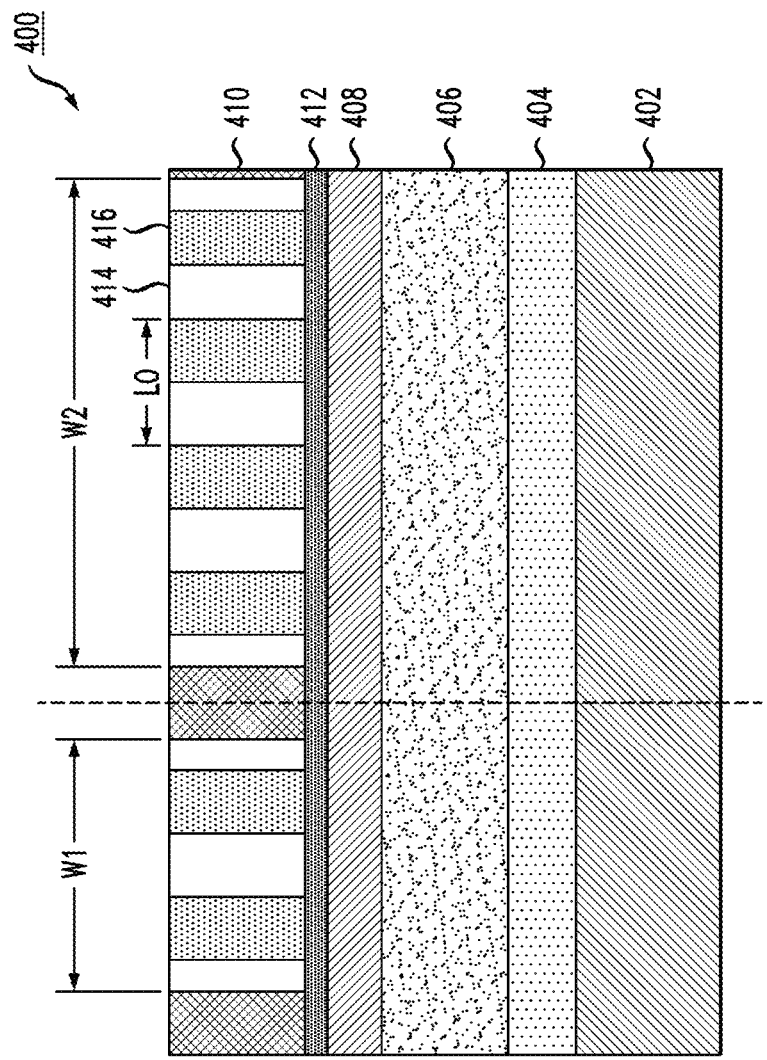

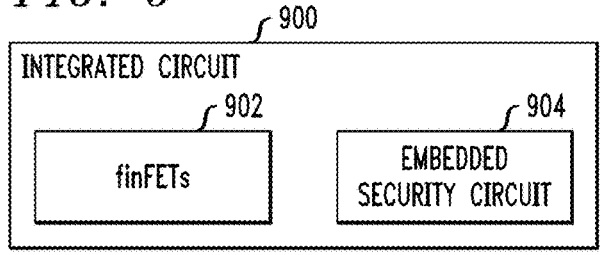
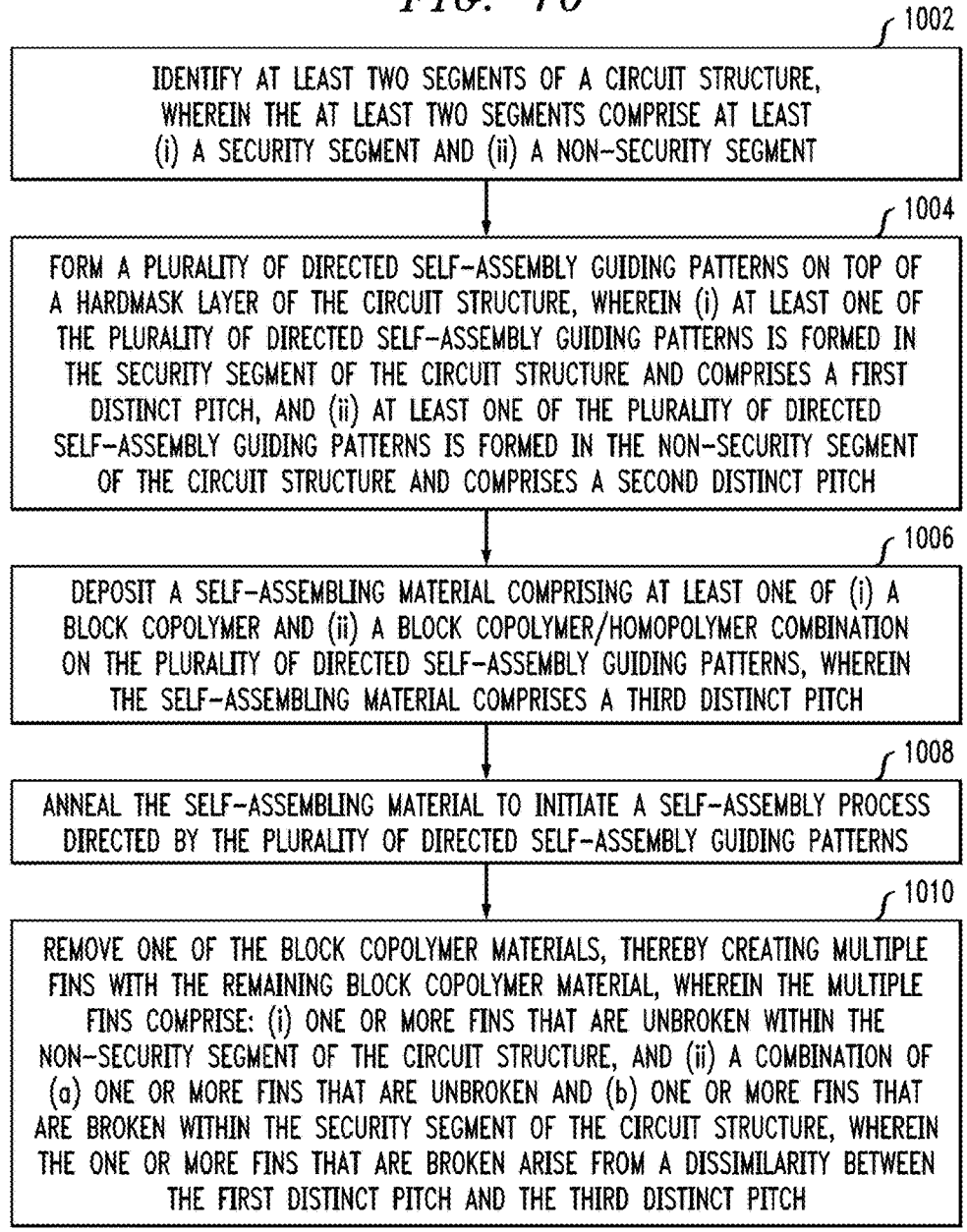

EMBEDDED SECURITY CIRCUIT FORMED BY DIRECTED SELF-ASSEMBLY

FIELD

The present application generally relates to integrated circuit technology and, more particularly, to integrated circuit security techniques.

BACKGROUND

Integrated circuit (chip) security is important for a variety of applications, such as, for example, Internet-of-things applications. Due to the proliferation of computing devices (such as laptops, tablets, smartphones, etc.), applications and systems seek to ensure proper identification of the computing devices that attempt to gain access thereto. Further, in a communication session between two or more computing devices, one computing device typically seeks to ensure and/or confirm the identity of the one or more additional computing devices with which it is communicating.

SUMMARY

In one embodiment of the present invention, embedded security circuits formed by directed self-assembly (DSA) are provided. An exemplary method can include identifying at least two segments of a circuit structure, wherein the at least two segments comprise at least (i) a security segment and (ii) a non-security segment. Such a method can also include forming a plurality of directed self-assembly guiding patterns (GPs) on top of a hardmask layer of the circuit structure, wherein (i) at least one of the plurality of directed self-assembly guiding patterns is formed in the security segment of the circuit structure and comprises a first distinct pitch, and (ii) at least one of the plurality of directed self-assembly guiding patterns is formed in the non-security segment of the circuit structure and comprises a second distinct pitch. Additionally, such a method can include depositing a self-assembling material comprising at least one of (i) a block copolymer and (ii) a block copolymer/homopolymer combination on the plurality of directed self-assembly guiding patterns, wherein the self-assembling material comprises a third distinct pitch, and annealing the self-assembling material to initiate a self-assembly process directed by the plurality of directed self-assembly guiding patterns. Such a method can further include removing one of the block copolymer materials, thereby creating multiple fins with the remaining block copolymer material, wherein the multiple fins comprise: (i) one or more fins that are unbroken within the non-security segment of the circuit structure, and (ii) a combination of (a) one or more fins that are unbroken and (b) one or more fins that are broken within the security segment of the circuit structure, wherein the one or more fins that are broken arise from a dissimilarity between the first distinct pitch and the third distinct pitch.

In another embodiment of the invention, an exemplary method can include identifying at least two segments of a circuit structure, wherein the at least two segments comprise at least (i) a security segment and (ii) a non-security segment. Such a method can also include forming a plurality of raised directed self-assembly guiding patterns on top of a hardmask layer of the circuit structure, wherein (i) at least one of the plurality of raised directed self-assembly guiding patterns is formed in the security segment of the circuit structure and comprises a first distinct width, and (ii) at least one of the plurality of raised directed self-assembly guiding patterns is formed in the non-security segment of the circuit structure and comprises a second distinct width. Additionally, such a method can include depositing a self-assembling material comprising at least one of (i) a block copolymer and (ii) a block copolymer/homopolymer combination between the plurality of directed self-assembly guiding patterns, wherein the self-assembling material comprises a distinct pitch, and annealing the self-assembling material to initiate a self-assembly process directed by the plurality of raised directed self-assembly guiding patterns. Further, such a method can include removing one of the block copolymer materials, thereby creating multiple fins with the remaining block copolymer material between the plurality of raised directed self-assembly guiding patterns, and wherein the multiple fins comprise: (i) one or more fins that are unbroken within the non-security segment of the circuit structure, and (ii) a combination of (a) one or more fins that are unbroken and (b) one or more fins that are broken within the security segment of the circuit structure, wherein the one or more fins that are broken arise from a dissimilarity between the first distinct width and the distinct pitch.

In yet another embodiment of the invention an integrated circuit can include a set of one or more fin field effect transistor devices unrelated to one or more security devices of the integrated circuit; and an embedded security circuit structure comprising an array of fin field effect transistor devices related to the one or more security devices of the integrated circuit, wherein the array comprises a combination of (i) one or more fin field effect transistor devices with unbroken fin channels and (ii) one or more fin field effect transistor devices with broken fin channels, and wherein the combination forms a distinct code to be associated with the integrated circuit.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 4 is a cross-sectional side view illustrating regular FET regions and security FET regions formed using a graphoepitaxy approach, according to an example embodiment of the invention;

FIG. 9 is a diagrammatic view of an integrated circuit, according to an example embodiment of the invention;

FIG. 10 is a flow diagram illustrating techniques according to an example embodiment of the invention.

DETAILED DESCRIPTION

Figure 1:
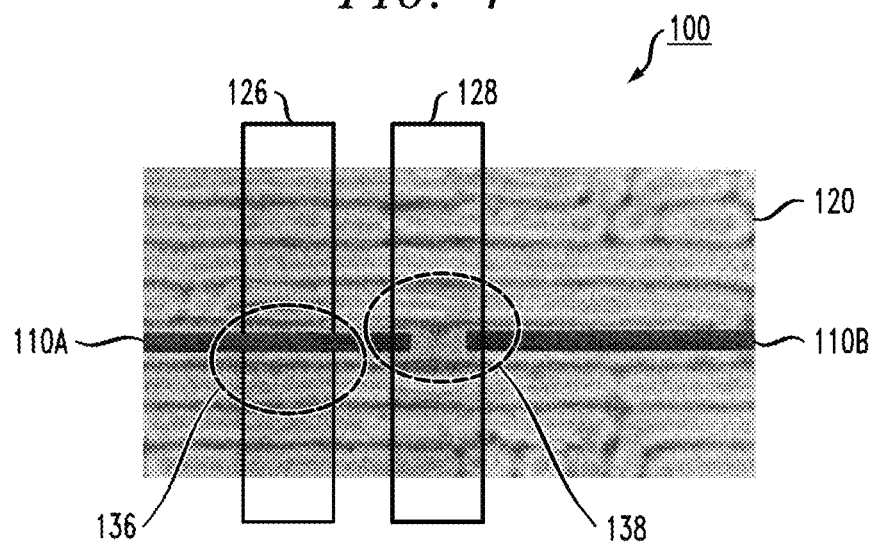
FIG. 1 illustrates a first fin field effect transistor (finFET) having a continuous fin channel and a second finFET having a broken fin channel, according to an example embodiment of the invention.

As described herein, an embodiment of the present invention includes embedded security circuits formed by directed self-assembly. Accordingly, one or more embodiments of the invention will herein be described in further detail with regard to techniques for forming semiconductor devices with embedded security circuits. It is to be understood that the various layers, structures, and/or regions shown in the accompanying drawings are illustrations that are not necessarily drawn to scale. In addition, for ease of explanation, one or more layers, structures, and/or regions of a type commonly used to form semiconductor devices or structures may not be explicitly shown in a given drawing. This does not imply that any layers, structures, and/or regions not explicitly shown are omitted from the actual semiconductor devices or structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present such as, for example, 1% or less than the stated amount. Also, in the figures, the illustrated scale of one layer, structure, and/or region relative to another layer, structure, and/or region is not necessarily intended to represent actual scale.

It is to be further understood that because, for a FET structure during formation, an active region can be designated as a drain active region or a source active region, reference is made herein to "source/drain" active regions to denote the interchangeable designation.

Illustrative embodiments for forming devices for providing an embedded security circuit on an integrated circuit will be described below with reference to the detailed figures. Each of the semiconductor structures detailed in the figures can be implemented in connection with one or more steps (as detailed herein) used in the process of providing an embedded security circuit on an integrated circuit.

Advantageously, an embedded security code such as described in connection with one or more embodiments of the invention can be employed as part of a physically unclonable function (PUF). Such a PUF is difficult to attack, can be randomly generated, and can be produced at a low cost. Conventional approaches for implementing a PUF require additional process steps and thus increase process cost and complexity. However, because the process of forming devices for the embedded security code can be part of the fabrication process for forming other functional devices (that is, devices not used for providing an embedded security code) on the integrated circuit, a cost-effective technique for fabricating integrated circuits with PUF finFETs is provided according to one or more embodiments of the invention.

Given the illustrative teachings herein, one of ordinary skill in the art will appreciate an appropriate order in which various structures, layers, and/or regions in FIGS. 1 through 8 can be formed. Also, wherein dimensions and materials are not expressly stated for a given structure, layer, and/or region, it is to be understood that they may be selected based on standard semiconductor practices by those of ordinary skill in the art.

For highly-scaled transistors such as finFET and nanowire FET, sub-lithography patterning can be implemented to increase transistor density on a chip. One technique for forming sub-lithography patterning (e.g., fin pitch below 30 nanometers (nm)) is DSA. At least one embodiment of the invention includes forming a security circuit that is embedded in integrated finFET circuits. The security circuit can be fabricated by leveraging patterning-dependency associated with directed self-assembly. Additionally, the security circuit can include an array of finFETs with one or more continuous fin channels and one or more broken fin channels that form a random and unique code for each chip.

DSA processes that can be used in forming embedded security circuits include, for example, chemoepitaxy DSA and graphoepitaxy DSA. DSA performance can have a strong dependency on the geometry of the guiding patterns, including critical dimension (CD) and/or pitch and the material commensurability with the design. Example implementations can include creating and controlling imperfect DSA features. For example, a DSA process can include clean parallel lines and spaces. Additionally, a DSA process can include an intentional patterning variation resulting from CD mismatch, material mismatch and/or design and material mismatch.

One or more embodiments of the invention include utilizing controllable random features derived from DSA to create security finFET regions in addition to regular finFET regions, wherein a security region can be defined by the same photolithography mask as a regular finFET region. As used herein, controllable randomness refers to the probability that DSA defects (broken lines) can be controlled by process and design parameters described herein, while the location of the defects are randomly distributed over the security region. Utilizing the same photolithography mask can reduce the costs associated with forming an embedded security circuit.

One or more embodiments of the invention can include implementing an intentional patterning variation resulting from a material mismatch, wherein the natural pitch of the material is dissimilar and/or incommensurable (that is, lacking a common measurement) to the designed pitch of the guiding pattern. Such an embodiment can include utilizing such a patterning variation to form fins for one or more regular circuits and for one or more security circuits. The fins formed in the regular region can be, for example, without defect, while the fins formed in the security region can include one or more defects.

FIG. 1 illustrates structure 100 that includes two finFETs in the security region 120 formed utilizing, for example, a material mismatch. A first finFET 136 (also referred to herein as a "good" finFET) includes gate 126 formed over continuous fin channel 110A. A second finFET 138 (also referred to herein as a "bad" finFET) includes gate 128 formed over a broken fin channel, the broken fin channel comprising portions of fin 110A and fin 110B. As detailed herein, finFETs formed over broken fin channels generate a drain current close to zero and referred to herein as a logic "0" state, while those finFETs formed over continuous fin channels generate a (non-trivial) drain current and are referred to herein as a logic "1" state. In one or more embodiments of the invention, more than one fin can be used to create the FET, wherein the current level can be quantized. In such an embodiment, a threshold can be applied to differentiate between a logic "1" state and a logic "0" state, or a multi-bit security code can be generated.

Figure 2:
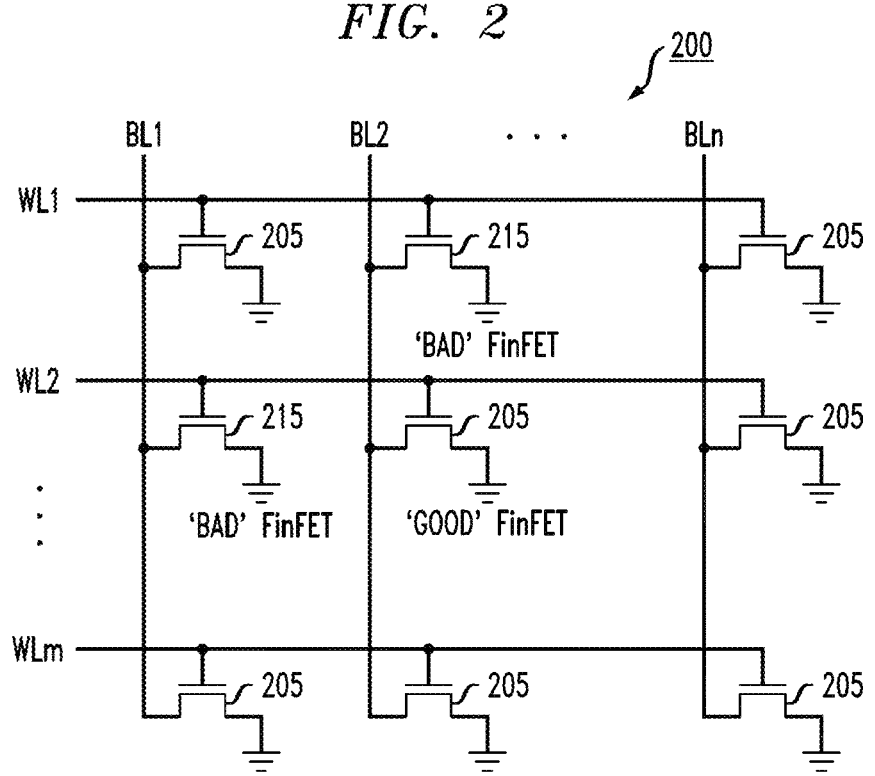
FIG. 2 is a schematic view of a FET device array providing an embedded security circuit, according to an example embodiment of the invention.

As also detailed herein, an array with sufficient bits or segments of broken ("bad") and continuous ("good") finFETs can produce a random and unique security code on an integrated circuit chip, as illustrated in structure 200 of FIG. 2. Specifically, FIG. 2 illustrates an embedded security circuit structure 200 formed from an M×N array of finFET transistor devices used to generate a security code for an integrated circuit in which the array is formed. The array includes a random number of "bad" finFETs, while the rest of the finFETs are "good" finFETs. When voltage is applied to the "bad" finFETs by the word lines (WL) and bit lines (BL), no current will be drawn through these devices. In the array 200, "good" finFETs (that is, finFETs that are not defective) are labeled 205, while "bad" finFETs (that is, finFETs that are defective) are labeled 215.

Figure 3:
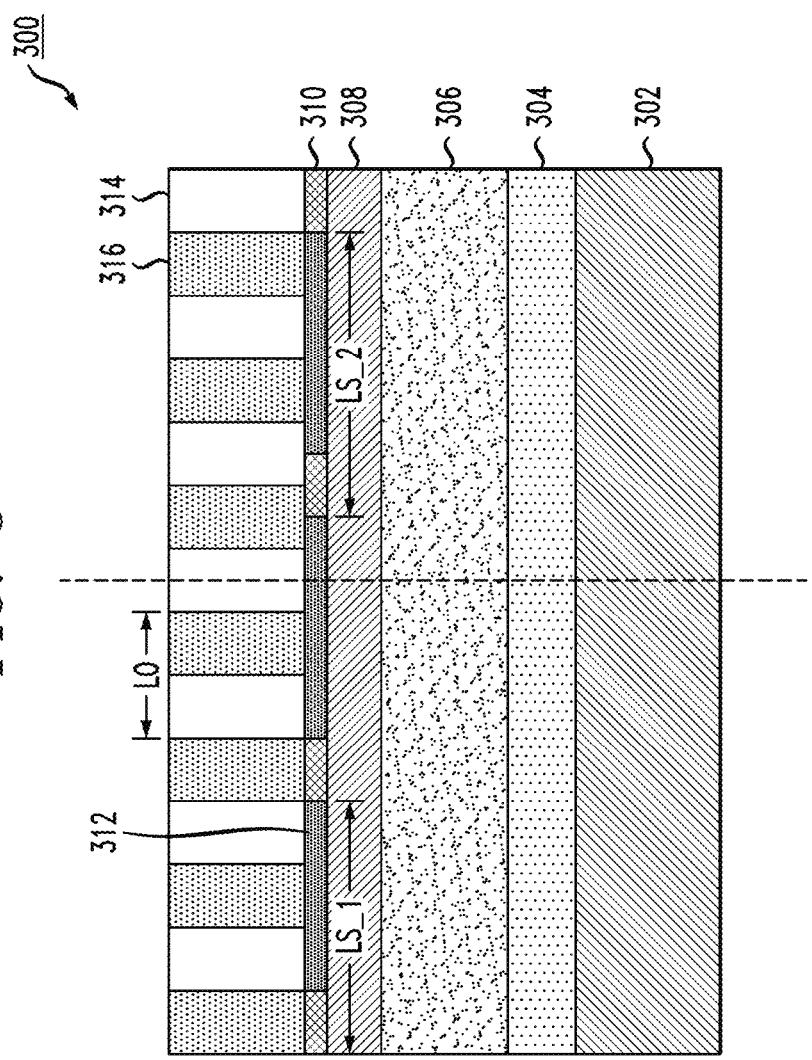
FIG. 3 is a cross-sectional side view illustrating regular FET regions and security FET regions formed using a chemoepitaxy approach, according to an example embodiment of the invention.

FIG. 3 illustrates a structure 300 formed utilizing a chemoepitaxy approach. Structure 300 illustrates forming both regular FET regions (left of the vertical dashed line) and security FET regions (right of the vertical dashed line), wherein a random number of finFETs formed in the security FET regions will have defects. Such a process flow starts by utilizing a semiconductor substrate stack, which may comprise a silicon (Si) substrate 302, a buried oxide layer (BOX) 304, and an SOI layer 306. A hardmask 308 (e.g., silicon nitride) can be deposited onto the semiconductor substrate. DSA guiding pattern, which is comprised of a preferential material 310 and a non- or weakly-preferential material 312, can be fabricated by lithography, etch, spin coating, annealing and/or a rinsing processes. The regular finFET(s) and the security finFET(s) have different pitches (Ls_1 and Ls_2, respectively), and are defined in the lithography process. L0, as indicated on FIG. 3, is the natural pitch of block copolymer, which is composed of the first block 314 and the second block 316. By way of example, in one or more embodiments of the invention, block 314 can include polystyrene (PS), and block material 316 can include poly (methyl methacrylate) (PMMA).

Also, referring again to the various above-noted pitches, the relationship between the natural pitch L0 and the different pitches Ls_1 and Ls_2, in accordance with one or more embodiments of the invention (such as depicted in FIG. 3, for example), can include the following:

Ls_1=N1*L0, wherein N1 is an integer, and

Ls_2=(N2+r)*L0, wherein N2 is an integer and r is a non-integer real number that will affect the percentage/amount of defects to be created in a security structure.

FIG. 4 illustrates a structure 400 formed utilizing a graphoepitaxy approach. Structure 400 illustrates forming both regular FET regions (left of the vertical dashed line) and security FET regions (right of the vertical dashed line), wherein a random number of finFETs formed in the security FET regions will have defects. Such a process flow starts by utilizing a semiconductor substrate stack, which may comprise a Si substrate 402, a BOX layer 404, and an SOI layer 406. A hardmask 408, (e.g., silicon nitride) can be deposited onto the semiconductor substrate. Also, a blanket non-preferential layer 412 and a resist 410 can be deposited above the hardmask 408 to a height such that a pattern is defined (by the resist). Self-assembling block copolymers, composed of block 414 (PMMA) and block 416 (PS), are then spin-coated between the guiding patterns and directed to assemble.

As also depicted in FIG. 4, W1 represents the width between the resists defining the regular FET region, while W2 represents the width between the resists defining the security FET region. L0, as indicated on FIG. 4, represents the natural pitch of block copolymer materials 414 (PMMA) and 416 (PS). Also, in one or more embodiments of the invention, the relationship between the natural pitch L0 and the different widths W1 and W2 can include the following:

W1=N1*L0, wherein N1 is an integer, and

W2=(N2+r)*L0, wherein N2 is an integer and r is a non-integer real number (as noted above).

Figure 5A:
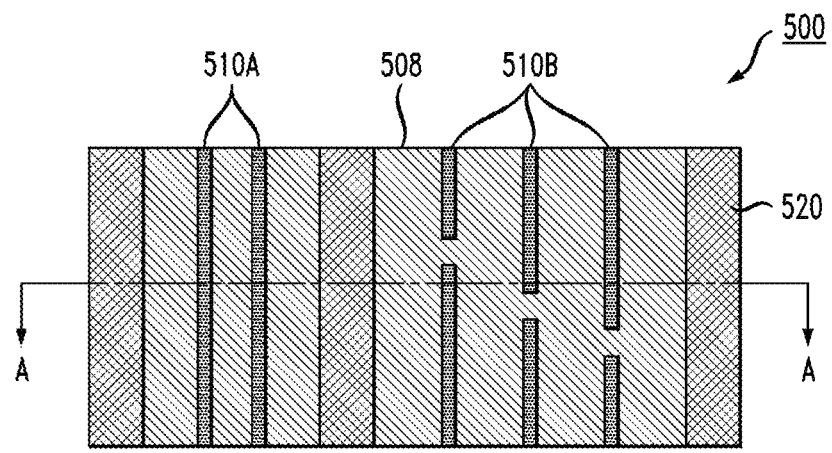
FIG. 5A is a top-down view illustrating regular FET and security FET regions after directed self-assembly (DSA) patterns are formed, according to an example embodiment of the invention.
Figure 5B:
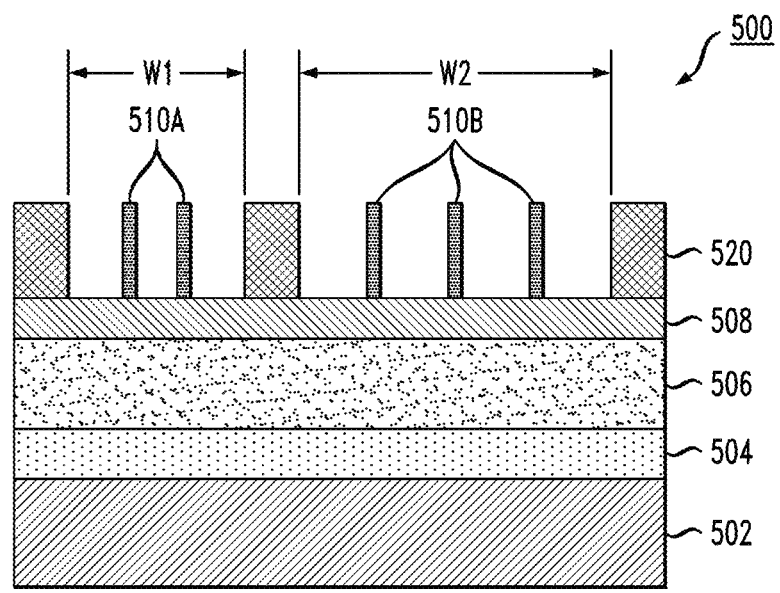
FIG. 5B is a cross-sectional side view illustrating regular FET and security FET regions after DSA patterns are formed, according to an example embodiment of the invention.

FIGS. 5A and 5B are top-down and cross-sectional views, respectively, illustrating regular FET region and security FET regions after DSA of the block co-polymers and the removal of one of the blocks, which may involve selective etching, tone-inversion, and/or selective metallization processes. Also, it should be noted that FIGS. 5A and 5B are not derived from FIG. 4. FIG. 5A shows continuous DSA lines 510A (bracketed by portions of resist 520) formed on hardmask 508 in the regular FET region, as well as broken DSA lines 510B (bracketed by portions of resist 520) formed on hardmask 508 in the security FET region. It is noted that, in accordance with one or more embodiments of the invention, DSA lines 510A and 510B can include material 416 (PS), which remains after block copolymer material 414 (PMMA) has been etched away. Also, FIG. 5B is a cross-sectional view of FIG. 5A taken along cross-sectional view A-A and including views of a Si substrate 502, a BOX layer 504, and an SOI layer 506.

Figure 6A:
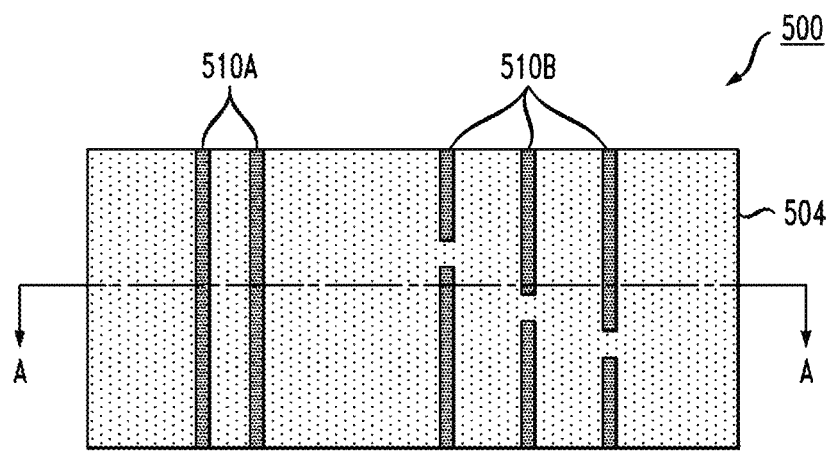
FIG. 6A is a top-down view illustrating regular FET and security FET regions after transfer of the DSA patterns into the hardmask and silicon on insulator (SOI) forming fins, according to an example embodiment of the invention.
Figure 6B:
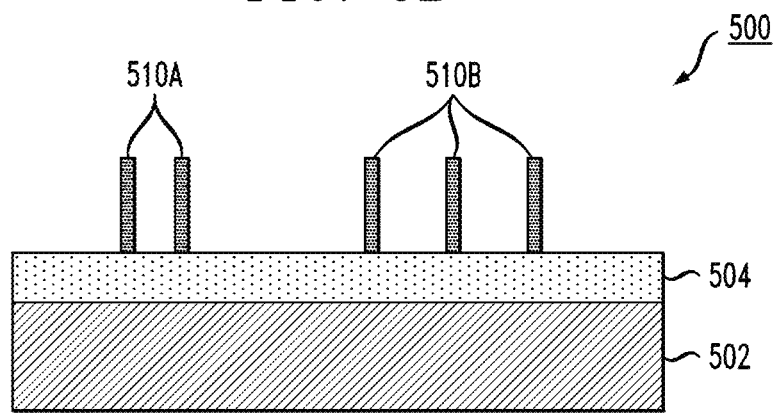
FIG. 6B is a cross-sectional side view illustrating regular FET and security FET regions after transfer of the DSA patterns into the hardmask and SOI forming fins, according to an example embodiment of the invention.

In FIGS. 6A and 6B, the DSA patterns depicted in FIGS. 5A and 5B are transferred into the hardmask 508 and SOI layer 506, leaving fins 510A and 510B formed on the buried oxide layer 504. FIG. 6B is a cross-sectional view of FIG.

6A (which is a top-down view) taken along cross-sectional view A-A. Additionally, fins 510A are located in the regular FET region, while fins 510B are located in the security FET region.

Figure 7A:
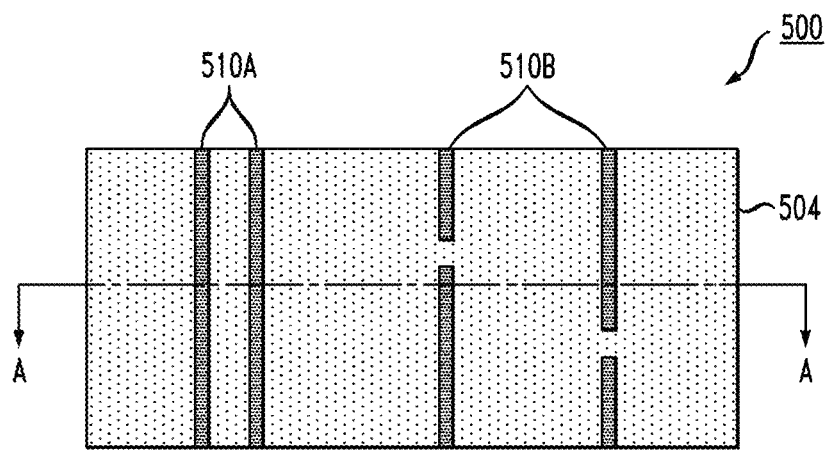
FIG. 7A is a top-down view illustrating regular FET and security FET regions after removal of dummy fins, according to an example embodiment of the invention.
Figure 7B:
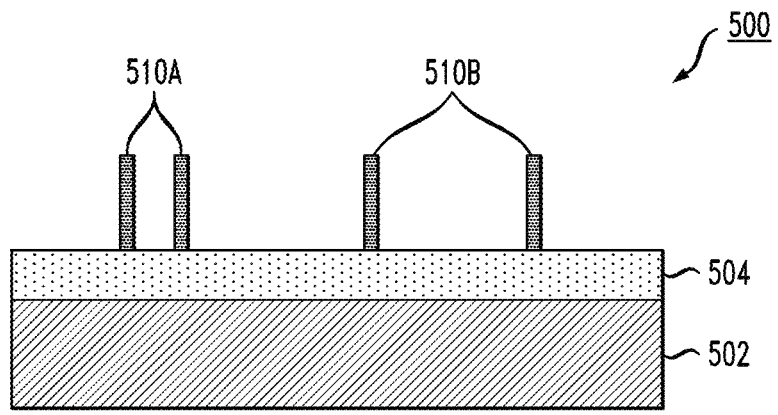
FIG. 7B is a cross-sectional side view illustrating regular FET and security FET regions after removal of dummy fins, according to an example embodiment of the invention.

FIGS. 7A and 7B are top-down and cross-sectional views, respectively, illustrating the regular FET region and security FET regions depicted in FIGS. 6A and 6B after removal of one or more (dummy) fins. For example, FIG. 7A and FIG. 7B both illustrate that one of the three fins in the security FET region has been removed. In one or more embodiments of the invention, fins can be removed, for example, because only a certain number and/or configuration of fins is needed for a desired array to generate a particular code.

Figure 8A:
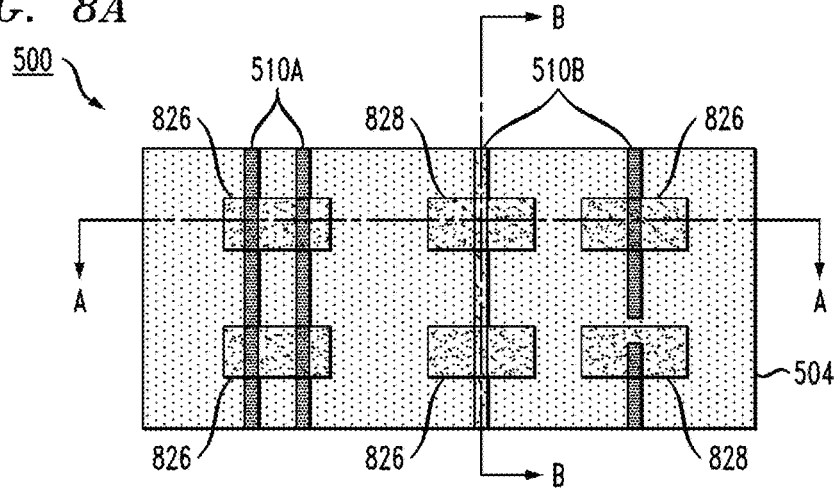
FIG. 8A is a top-down view illustrating a continued complementary metal-oxide semiconductor (CMOS) process forming gates, source/drains, etc., according to an example embodiment of the invention.
Figure 8B:
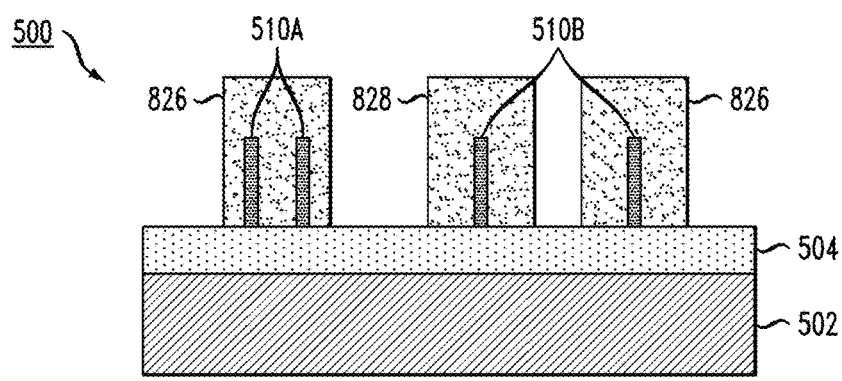
FIG. 8B is a cross-sectional side view along section A-A of FIG. 8A, according to an example embodiment of the invention.
Figure 8C:
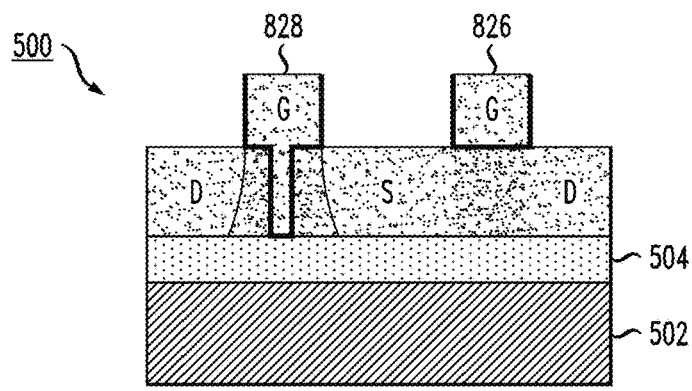
FIG. 8C is a cross-sectional side view along section B-B of FIG. 8A, according to an example embodiment of the invention.

Continuing with CMOS processing to form gates, spacers, source/drain, contacts, etc., FIG. 8A (top-down view), FIG. 8B (cross-section view A-A), and FIG. 8C (cross-section view B-B) illustrate the structure 500 in which gates have been formed on the fin structures of FIGS. 7A and 7B in both the regular FET regions and the security FET regions. "Good" FETs are formed in the regular FET region. In the security FET region, however, some of the FETs formed are "good" FETs, while others are "bad" FETs, as described herein. As illustrated, gates 826 formed over continuous fins comprise "good' FETs while gates 828 formed over broken fins comprise "bad" FETs. FIG. 8B is a cross-sectional view of FIG. 8A taken along cross-sectional view A-A wherein gate 828 formed over broken portion of fin 510B forms a "bad" FET. Gate 826 formed over a continuous (unbroken) portion of fin 510B forms a "good" FET. Additionally, FIG. 8C illustrates a cross-sectional view of FIG. 8A taken along cross-sectional view B-B. Gate 828 is shown in FIG. 8C as protruding into what would have been the channel of the finFET.

FIG. 9 illustrates an embedded security circuit structure 904 (such as, for example, circuit structure 200 in FIG. 2) formed from an M×N array of finFET transistor devices used to generate a security code for an integrated circuit in which the array is formed. That is, in an illustrative embodiment, an integrated circuit 900, as shown in FIG. 9, has array structure 904 of finFET devices for the specific purpose of providing a security code for the integrated circuit, while also having finFETs 902 that provide normal functioning (non-security purposes) for the integrated circuit. By way of example, finFET devices in array structure 904 can be formed in the security FET region as shown above in FIGS. 3 through 8C, and finFET devices 902 can be formed in the regular FET region as shown above in FIGS. 3 through 8C.

The array structure 904 comprises finFET devices whose gates are connected to a plurality of word lines WL1-WLm, and whose drains are connected to a plurality of bit lines BL1-BLn as shown, for example, in FIG. 2. In this example embodiment of the invention, the sources of the finFET devices are connected to ground. Alternatively, they could be connected to a voltage source. As mentioned above, the array of finFET devices in structure 200 are designed such that a random number of the devices in the array have gates formed over broken fins resulting in defective devices, as described in detail herein. Therefore, when voltage is applied to these finFETs by the word lines and bit lines, no current will be drawn through these devices. In the array 904 such as array structure 200 in FIG. 2, finFETs that are not defective are labeled accordingly (for example, as 205 in FIG. 2), while finFETs that are defective are labeled accordingly (for example, as 215 in FIG. 2). By measuring the finFETs of array structure 904, a unique random security code is generated for the integrated circuit 900.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

FIG. 10 is a flow diagram illustrating techniques according to an embodiment of the present invention. Step 1002 includes identifying at least two segments of a circuit structure, wherein the at least two segments comprise at least (i) a security segment and (ii) a non-security segment.

Step 1004 includes forming a plurality of directed self-assembly guiding patterns on top of a hardmask layer of the circuit structure, wherein (i) at least one of the plurality of directed self-assembly guiding patterns is formed in the security segment of the circuit structure and comprises a first distinct pitch, and (ii) at least one of the plurality of directed self-assembly guiding patterns is formed in the non-security segment of the circuit structure and comprises a second distinct pitch. In one or more embodiments of the invention, each of the plurality of directed self-assembly guiding patterns includes a preferential region and a non- or weakly-preferential region. Additionally, at least one embodiment of the invention can include implementing a cross-linker in one or more of the materials comprising the plurality of directed self-assembly guiding patterns.

Step 1006 includes depositing a self-assembling material comprising at least one of (i) a block copolymer and (ii) a block copolymer/homopolymer combination on the plurality of directed self-assembly guiding patterns, wherein the self-assembling material comprises a third distinct pitch. In one or more embodiments of the invention, the third distinct pitch comprises L0, the first distinct pitch comprises $Ls\_1=N1*L0$, wherein N1 is a predetermined integer, and the second distinct pitch comprises $Ls\_2=(N2+r)*L0$, wherein N2 is an integer and r is a non-integer real number.

Step 1008 includes annealing the self-assembling material to initiate a self-assembly process directed by the plurality of directed self-assembly guiding patterns. Step 1010 includes removing one of the block copolymer materials, thereby creating multiple fins with the remaining block copolymer material, wherein the multiple fins comprise: (i) one or more fins that are unbroken within the non-security segment of the circuit structure, and (ii) a combination of (a) one or more fins that are unbroken and (b) one or more fins that are broken within the security segment of the circuit structure, wherein the one or more fins that are broken arise from a dissimilarity between the first distinct pitch and the third distinct pitch. The combination of (a) one or more fins that are unbroken and (b) one or more fins that are broken within the security segment of the circuit structure can constitute a created security code that is used as part of a physically unclonable function.

The techniques depicted in FIG. 10 can also include depositing the hardmask layer on a semiconductor substrate of the circuit structure. Additionally, in one or more embodiments of the invention, the semiconductor substrate can include a silicon on insulator layer, and the hardmask layer can include silicon nitride. Further, the techniques depicted in FIG. 10 can include depositing multiple gates on the multiple fins such that (i) one or more of the multiple gates overlap one or more fins that are unbroken and (ii) one or more of the multiple gates overlap one or more fins that are broken. Also, at least one embodiment of the invention can further include removing one or more of the multiple fins.

Figure 11:
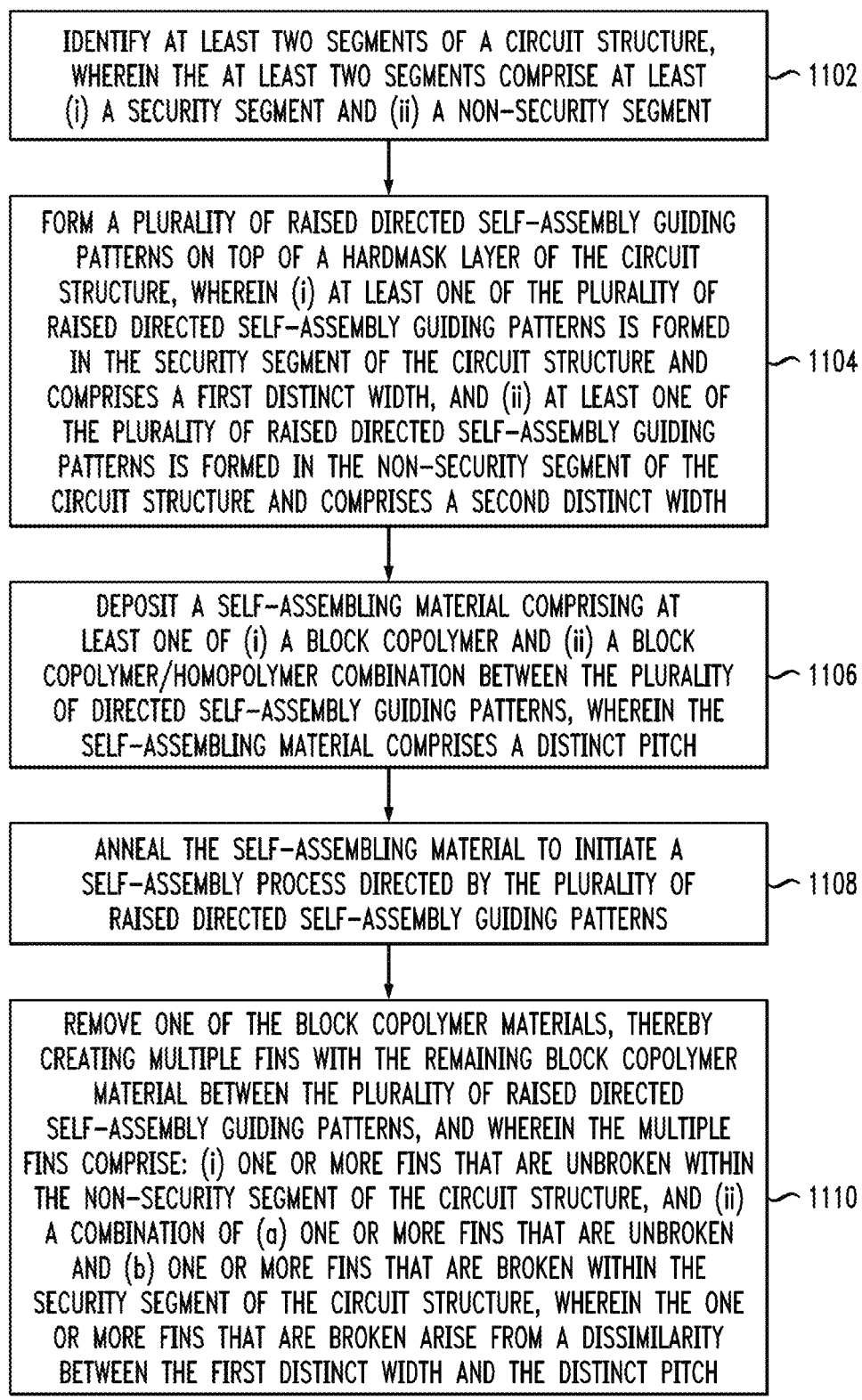
FIG. 11 is a flow diagram illustrating techniques according to an example embodiment of the invention.

FIG. 11 is a flow diagram illustrating techniques according to an embodiment of the present invention. Step 1102 includes identifying at least two segments of a circuit structure, wherein the at least two segments comprise at least (i) a security segment and (ii) a non-security segment.

Step 1104 includes forming a plurality of raised directed self-assembly guiding patterns on top of a hardmask layer of the circuit structure, wherein (i) at least one of the plurality of raised directed self-assembly guiding patterns is formed in the security segment of the circuit structure and comprises a first distinct width, and (ii) at least one of the plurality of raised directed self-assembly guiding patterns is formed in the non-security segment of the circuit structure and comprises a second distinct width. Each of the plurality of raised directed self-assembly guiding patterns can include a resist positioned on top of a blanket non-preferential layer. Additionally, at least one embodiment of the invention can include implementing a cross-linker in the plurality of raised directed self-assembly guiding patterns.

Step 1106 includes depositing a self-assembling material comprising at least one of (i) a block copolymer and (ii) a block copolymer/homopolymer combination between the plurality of directed self-assembly guiding patterns, wherein the self-assembling material comprises a distinct pitch. The distinct pitch can include L0, the first distinct width can include W1=N1*L0, wherein N1 is a predetermined integer, and the second distinct width can include W2=(N2+r)*L0, wherein N2 is an integer and r is a non-integer real number. Step 1108 includes annealing the self-assembling material to initiate a self-assembly process directed by the plurality of raised directed self-assembly guiding patterns.

Step 1110 includes removing one of the block copolymer materials, thereby creating multiple fins with the remaining block copolymer material between the plurality of raised directed self-assembly guiding patterns, and wherein the multiple fins comprise: (i) one or more fins that are unbroken within the non-security segment of the circuit structure, and (ii) a combination of (a) one or more fins that are unbroken and (b) one or more fins that are broken within the security segment of the circuit structure, wherein the one or more fins that are broken arise from a dissimilarity between the first distinct width and the distinct pitch. In one or more embodiments of the invention, the combination of (a) one or more fins that are unbroken and (b) one or more fins that are broken within the security segment of the circuit structure can constitute a created security code that is used as part of a physically unclonable function.

Additionally, the techniques depicted in FIG. 11 can also include implementing a cross-linker in the plurality of raised directed self-assembly guiding patterns within the resist and/or the non-preferential layer.

Additionally, at least one embodiment of the invention can include providing an integrated circuit (generated, for example, via the techniques depicted in FIG. 10 and/or FIG. 11). Such an integrated circuit can include a set of one or more fin field effect transistor devices unrelated to one or more security devices of the integrated circuit, and an embedded security circuit structure comprising an array of fin field effect transistor devices related to the one or more security devices of the integrated circuit, wherein the array comprises a combination of (i) one or more fin field effect transistor devices with unbroken fin channels and (ii) one or more fin field effect transistor devices with broken fin channels, and wherein the combination forms a distinct code to be associated with the integrated circuit. In such an embodiment, the distinct code can be used as part of a physically unclonable function. Additionally, the above-noted combination can include a random combination.

The techniques depicted in FIG. 10 and FIG. 11 can also, as described herein, be implemented in the form of an article of manufacture tangibly embodying computer readable instructions which, when implemented, cause a computing device to carry out a plurality of method steps. Furthermore, another embodiment of the invention or elements thereof can be carried out via implementation of an apparatus including a memory and at least one processor that is coupled to the memory and configured to perform noted method steps. Yet further, another embodiment of the invention or elements thereof can be implemented in the form of means for carrying out the method steps described herein, or elements thereof; the means can include hardware module(s) or a combination of hardware and software modules, wherein the software modules are stored in a tangible computer-readable storage medium (or multiple such media).

Additionally, it is to be understood that the methods discussed herein can be incorporated in various semiconductor process flows to fabricate interconnect structures in conjunction with integrated circuits having analog and digital circuitry or mixed-signal circuitry. In particular, integrated circuit dies can be fabricated with various devices such as finFET devices, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, creating security finFET regions in addition to regular finFET regions, wherein a security region can be defined by the same photolithography mask as a regular finFET region.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    defining at least two regions of a circuit structure on a substrate, wherein the at least two regions comprise a security region and a non-security region;
    forming a guiding pattern on the substrate, wherein the guiding pattern comprises a plurality of raised features formed within the security and non-security regions, wherein the raised features of the guiding pattern formed within the non-security region are separated by a first distinct width, and wherein the raised features of the guiding pattern formed within the security region are separated by a second distinct width;
    depositing a self-assembling material comprising at least one of a block copolymer and a block copolymer/homopolymer combination, within spaces between the raised features of the guiding pattern, wherein the self-assembling material comprises block materials that are configured to assemble into a block pattern with a natural pitch;
    annealing the self-assembling material to initiate a self-assembly process directed by the plurality of raised features of the guiding pattern, and form block patterns of the block materials within the spaces between the raised features of the guiding pattern; and
    selectively removing one of the block materials of the assembled block patterns to define a pattern of fin structures by the remaining block material in the spaces between the raised features of the guiding pattern;
    wherein the pattern of fin structures comprises a pattern of unbroken fin structures within the non-security region, and a pattern of broken fin structures within the security region;
    wherein the broken fin structures comprise discontinuous regions that are formed due to a dissimilarity between the second distinct width and the natural pitch of the block materials of the self-assembling material.

2. The method of claim 1, wherein the guiding pattern comprises a patterned photoresist layer.

3. The method of claim 1, wherein the self-assembling material comprises a mixture of polystyrene (PS) and poly(methyl methacrylate) (PMMA) block materials.

4. The method of claim 3, wherein selectively removing one of the block materials of the assembled block patterns to define the pattern of fin structures comprises etching the PMMA block material selective to the PS block material so that the pattern of fin structures comprises PS fin structures.

5. The method of claim 1, wherein the block patterns within the spaces between the raised features of the guiding pattern comprise alternating block sequences of the block materials.

6. The method of claim 1, further comprising transferring an image of the pattern of fin structures into an underlying semiconductor layer to form a pattern unbroken semiconductor fins in the non-security region of the circuit structure and a pattern of broken semiconductor fins in the security region of the circuit structure, which correspond to the pattern of fin structures in the security and non-security regions of the circuit structure.

7. The method of claim 6, further comprising etching away one or more of the broken semiconductor fins in the security region of the circuit structure.

8. The method of claim 6, wherein the substrate comprises a hardmask layer formed on the semiconductor layer, and wherein transferring the image of the pattern of fin structures into the underlying semiconductor layer comprises:
    patterning the hardmask layer using the pattern of fin structures to form an etch hard mask which comprises an image of the pattern of fin structures, and
    patterning the semiconductor layer using the etch hard mask to transfer the image of the etch hard mask into the semiconductor layer to form the pattern of semiconductor fins.

9. The method of claim 8, wherein the semiconductor layer comprises an active silicon layer of a silicon-on-insulator (SOI) substrate, wherein the pattern of semiconductor fins is disposed on a buried oxide layer of the SOI substrate.

10. The method of claim 6, further comprising forming fin field effect transistor (FinFET) devices in the security region and the non-security region of the circuit structure;
    wherein the FinFET devices in the non-security region comprise gate structures formed over portions of the unbroken semiconductor fins;
    wherein the FinFET devices in the security region comprise gate structures formed over portions of the broken semiconductor fins;
    wherein at least one FinFET device in the security region comprises a gate structure that overlaps a discontinuous region of a broken semiconductor fin, rendering the at least one FinFET device non-functioning.

11. The method of claim 10, wherein the FinFET devices in the security region comprise a two-dimensional array of FinFET devices, wherein the two-dimensional array of FinFET devices comprises a random arrangement of functioning and non-functioning FinFET devices, wherein the random arrangement of functioning and non-functioning FinFET devices defines a security code of a physically unclonable function.

12. The method of claim 11, wherein the two-dimensional array of FinFET devices comprises rows of FinFET devices and columns of FinFET devices, wherein the method further comprises:
    connecting the gates of the FinFET devices in a given row to a word line;
    connecting drain regions of the FinFET devices in a given column to a bit line; and
    connecting source regions of the FinFET devices in the security region to a ground node.

13. The method of claim 1, wherein W1=N1*L0, wherein N1 is a predetermined integer, and wherein W2=(N2+r)*L0, wherein N2 is an integer and r is a non-integer real number, wherein W1 denotes the first distinct width, W2 denotes the second distinct width, and L0 denotes the natural pitch.

14. A method, comprising:
defining at least two regions of a circuit structure on a substrate, wherein the at least two regions comprise a security region and a non-security region;
forming a guiding pattern on the substrate, wherein the guiding pattern comprises a plurality features formed within the security and non-security regions, wherein the features of the guiding pattern formed within the non-security region are formed with a first distinct pitch, and wherein the features of the guiding pattern formed within the security region are formed with a second distinct pitch;
depositing a self-assembling material comprising at least one of a block copolymer and a block copolymer/homopolymer combination, within spaces between the raised features of the guiding pattern, wherein the self-assembling material comprises block materials that are configured to assemble into a block pattern with a natural pitch;
annealing the self-assembling material to initiate a self-assembly process directed by the plurality of features of the guiding pattern, and form block patterns of the block materials on the guiding pattern; and
selectively removing one of the block materials of the assembled block patterns to define a pattern of fin structures by the remaining block material;
wherein the pattern of fin structures comprises a pattern of unbroken fin structures within the non-security region, and a pattern of broken fin structures within the security region;
wherein the broken fin structures comprise discontinuous regions that are formed due to a dissimilarity between the second distinct pitch and the natural pitch of the block materials of the self-assembling material.

15. The method of claim 14, wherein the features of the guiding pattern comprise an alternating sequence of first and second striped features, wherein the first striped features comprise a preferential material and wherein the second striped features comprise a non-preferential or weak-preferential material.

16. The method of claim 14, wherein the self-assembling material comprises a mixture of polystyrene (PS) and poly (methyl methacrylate) (PMMA) block materials, wherein selectively removing one of the block materials of the assembled block patterns to define the pattern of fin structures comprises etching the PMMA block material selective to the PS block material so that the pattern of fin structures comprises PS fin structures.

17. The method of claim 14, further comprising transferring an image of the pattern of fin structures into an underlying semiconductor layer to form a pattern unbroken semiconductor fins in the non-security region of the circuit structure and a pattern of broken semiconductor fins in the security region of the circuit structure, which correspond to the pattern of fin structures in the security and non-security regions of the circuit structure.

18. The method of claim 17, further comprising forming fin field effect transistor (FinFET) devices in the security region and the non-security region of the circuit structure;
wherein the FinFET devices in the non-security region comprise gate structures formed over portions of the unbroken semiconductor fins;
wherein the FinFET devices in the security region comprise gate structures formed over portions of the broken semiconductor fins;
wherein at least one FinFET device in the security region comprises a gate structure that overlaps a discontinuous region of a broken semiconductor fin, rendering the at least one FinFET device non-functioning.

19. The method of claim 18, wherein the FinFET devices in the security region comprise a two-dimensional array of FinFET devices, wherein the two-dimensional array of FinFET devices comprises a random arrangement of functioning and non-functioning FinFET devices, wherein the random arrangement of functioning and non-functioning FinFET devices defines a security code of a physically unclonable function.

20. The method of claim 14, wherein Ls_1 denotes the first distinct pitch, wherein Ls_2 denotes the second distinct pitch, wherein L0 denotes the natural pitch, wherein Ls_1=N1*L0, wherein N1 is a predetermined integer, and wherein Ls_2=(N2+r)*L0, wherein N2 is an integer and r is a non-integer real number.

* * * * *